United States Patent
Bentley et al.

(10) Patent No.: US 8,194,489 B2
(45) Date of Patent: Jun. 5, 2012

(54) PAIRED PROGRAMMABLE FUSES

(75) Inventors: Steven Ross Bentley, Tucson, AZ (US);
Paul Merrill Greco, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 220 days.

(21) Appl. No.: 12/691,501

(22) Filed: Jan. 21, 2010

(65) Prior Publication Data
US 2011/0176380 A1    Jul. 21, 2011

(51) Int. Cl.
*G11C 17/18*    (2006.01)

(52) U.S. Cl. .......................... 365/225.7; 365/228; 365/201

(58) Field of Classification Search ............... 365/225.7, 365/228, 201
See application file for complete search history.

(56) References Cited

U.S. PATENT DOCUMENTS

| | | | |
|---|---|---|---|
| 4,812,675 A | 3/1989 | Goetting | 307/443 |
| 5,668,818 A | 9/1997 | Bennett et al. | 371/22.31 |
| 6,285,619 B1 | 9/2001 | Daniel et al. | 365/225.7 |
| 6,333,878 B2 * | 12/2001 | Ooishi | 365/200 |
| 6,477,075 B2 * | 11/2002 | Ooishi | 365/63 |
| 6,577,156 B2 * | 6/2003 | Anand et al. | 365/225.7 |
| 7,251,756 B2 | 7/2007 | Anand et al. | 714/710 |
| 7,308,598 B2 | 12/2007 | Beattie et al. | 714/5 |
| 7,461,268 B2 | 12/2008 | Drehmel et al. | 713/193 |
| 7,528,646 B2 | 5/2009 | Aipperspach et al. | 327/525 |
| 7,663,957 B2 * | 2/2010 | Henry et al. | 365/225.7 |
| 7,724,022 B1 | 5/2010 | Deskin et al. | |
| 2005/0289355 A1 | 12/2005 | Kitariev et al. | 713/182 |
| 2006/0131743 A1 | 6/2006 | Erickson et al. | 257/737 |
| 2007/0039060 A1 | 2/2007 | Jamieson et al. | 726/34 |
| 2007/0127284 A1 | 6/2007 | Kawashima et al. | 365/96 |
| 2007/0247182 A1 | 10/2007 | Beatty et al. | 326/8 |
| 2007/0262357 A1 | 11/2007 | Ueda | 257/249 |
| 2008/0182592 A1 | 7/2008 | Cha et al. | 455/456.3 |
| 2009/0045867 A1 | 2/2009 | Kwong et al. | 327/525 |

OTHER PUBLICATIONS

IBM, Low-Cost method for Private Encryption Key Management, Loaded into IP.com Prior Art Database on Dec. 17, 2003 UTC.

* cited by examiner

*Primary Examiner* — Tuan T. Nguyen
(74) *Attorney, Agent, or Firm* — John H. Holcombe

(57) ABSTRACT

A plurality of fuses are arranged in pairs and configured such that each pair of fuses represents a data bit when one fuse of the pair is blown; represents an un-programmed bit when no fuse of the pair is blown; and represents a zero-ized bit when both fuses of the pair are blown. A fuse programming system programs the fuses of the pairs such that each pair represents a bit, comprising blowing a first fuse of a pair to represent a "1" bit, blowing a second fuse of a pair to represent a "0" bit, and blowing both fuses of a pair to represent a zero-ized pair, whereby if neither fuse of a pair is blown represents a null, un-programmed bit.

25 Claims, 6 Drawing Sheets

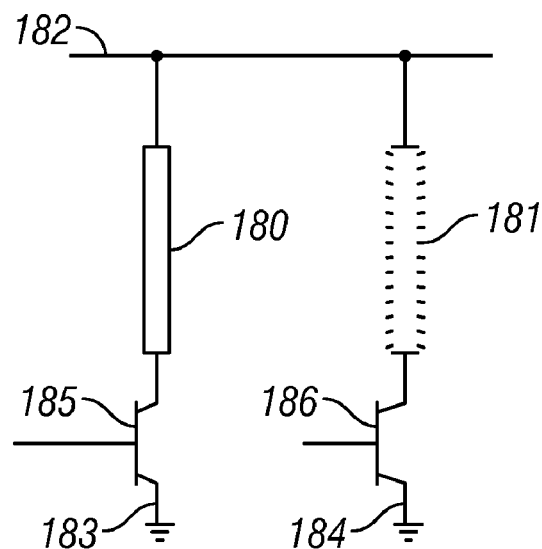
FIG. 3
(Prior Art)
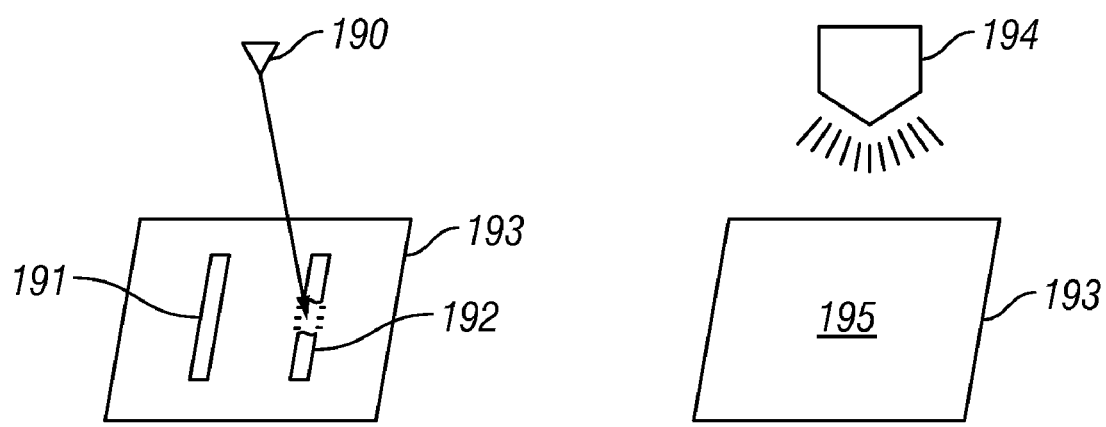
FIG. 4A
(Prior Art)
FIG. 4B
(Prior Art)

PAIRED PROGRAMMABLE FUSES

DOCUMENT INCORPORATED BY REFERENCE

Commonly assigned U.S. Pat. No. 7,461,268, issued Dec. 2, 2008, is incorporated for its showing of the use of electrically programmable fuses called "e-Fuses" to provide persistent storage of data.

FIELD OF THE INVENTION

This invention relates to persistent storage of data by means of fuses, and more particularly to the programming and encoding of such fuses.

BACKGROUND OF THE INVENTION

Fuses may be arranged to provide persistent storage of data, for example, by selectively blowing the fuses to encode the data. A fuse is typically considered to be a binary "0" if the fuse is intact, and a binary "1" if the fuse is blown. Thus, selectively blowing fuses creates a binary number.

Examples of fuses used for persistent storage of data comprise e-Fuses and laser fuses. As discussed in the incorporated '268 patent, e-Fuses are electrically programmable or written by applying a high blow voltage to a fuse. The data is read by latching the data into registers. Laser fuses are blown by applying a laser to the fuse to overheat it.

Fuses may be employed to encode data that is intended to persist unchanged and that is desired to be maintained indefinitely without requiring battery backup. One example of such data comprises a device serial number and data about the device. Once the data has been encoded, the data typically cannot be changed. Another example comprises a permanent encryption key such as that may be used for encrypting and decrypting data about a device in which the fuses are embedded, such as device metadata. An encryption engine will have the only access to the encryption key for encrypting or decrypting the data, but there is no alternate access once the key has been encoded.

Data about a device may be encoded by, for example, the device manufacturer at a specific facility. Encryption keys require full security and are encoded at a full security location, and, once encoded, further encoding may be prevented by destroying access to the encoding apparatus. In the case of laser fuses, the encoded fuses may be covered by a layer preventing optical reading of the fuses and preventing further encoding. In the case of e-Fuses, external access to the encryption keys may be restricted and writing prevented, for example, by blowing a master fuse, or, as discussed in the incorporated '268 patent, the e-Fuses may implement monotonic updates in one direction with time, such as a version value that may only be increased.

An issue may comprise the possible introduction of one or more errors into the encoding process in that a fuse may accidentally be blown before, during and after the encoding process. Typically, such an error requires that the entire chip embodying the fuses must be rejected. Once the master fuse has been blown, there may be no way to determine whether an intended unblown fuse has been blown. All a user would know is that the device embodying the chip no longer works because it cannot properly read its metadata. Another issue may comprise the disposition of the encoded fuses that are no longer needed or are compromised. The disposition must be protected to prevent unauthorized use.

SUMMARY OF THE INVENTION

Methods, fuse encoding systems, fuse programming systems, and devices are provided.

In one embodiment, a fuse encoding system comprises a plurality of fuses arranged in pairs and configured such that each pair of fuses represents a data bit when one fuse of the pair is blown; represents an un-programmed bit when no fuse of the pair is blown; and represents a zero-ized bit when both fuses of the pair are blown. Arranging the fuses in pairs allows detection and reporting of valid bits without identifying the value of any bit.

In a further embodiment, the fuse encoding system additionally comprises a detection system configured to detect whether any pair of fuses is zero-ized, which for example could render the set of fuses unusable.

In another embodiment, a fuse programming system comprises a plurality of fuses arranged in pairs; and a fuse blowing system configured to program the fuses of the pairs such that each pair represents a bit, comprising to blow a first fuse of a pair to represent a "1" bit, to blow a second fuse of a pair to represent a "0" bit, and to blow both fuses of a pair to represent a zero-ized pair, whereby if neither fuse of a pair is blown represents a null, un-programmed bit.

In a further embodiment, a test system is configured to test both bits of a pair of fuses prior to programming the pair of fuses to test whether either fuse of the pair is blown.

Still further, in one embodiment, a storage system is configured to identify any bit pair found by the test system to have a fuse of the pair blown; and the fuse blowing system is configured to skip and not blow any fuse of the found pair of fuses. There is a 50 percent chance that the blown fuse is correct.

In a still further embodiment, a trial test system is configured for testing the validity of the programming by running a trial; and, if the trial fails, indicating that the identified bit pair comprises an inverted bit. A trial failure indicates that the blown fuse is incorrect. It may be possible to alter the data to fit the inverted bit.

In another embodiment, a detection system is configured to detect, prior to programming any of the pairs, whether all of the pairs of fuses comprise null un-programmed bits, else if any pair is other than null.

In still another embodiment, a test system is configured to test the validity of each pair of fuses subsequent to programming the pair.

In one embodiment, the test system is configured to determine whether each pair of fuses has been programmed to a "1" bit or "0" bit, else that at least one bit pair is invalid.

In a further embodiment, the fuse blowing system is additionally configured to, if at least one bit pair is determined to be invalid, blow all unblown fuses of the pairs, thereby "zero-izing" the plurality of fuses.

In a still further embodiment, a detection system is configured to detect, subsequent to blowing the unblown fuses of the pairs, whether all the pairs of fuses is zero-ized, to thereby assure that the set of fuses unusable.

In another embodiment, a device comprises a functional system, a compromise detection system configured to detect whether the functional system is compromised, and an encoded fuse system comprising a plurality of fuses arranged in pairs and encoded such that each pair of fuses represents a data bit when one fuse of the pair is blown. A fuse blowing system is configured to respond to the compromise detection system detecting that the functional system is compromised, to blow all unblown fuses of the pairs, such that both fuses of each pair is blown to represent a zero-ized pair, thereby "zero-izing" the plurality of fuses, to thereby render the set of fuses unusable.

For a fuller understanding of the present invention, reference should be made to the following detailed description taken in conjunction with the accompanying drawings.

BRIEF DESCRIPTION OF THE DRAWINGS

FIG. 3 is a diagrammatic illustration of unblown and blown e-Fuses that may be implemented in the arrangement of fuses of FIG. 1;

FIGS. 4A and 4B are diagrammatic illustrations of fuses blown and unblown by a laser system and a system for covering the fuses that may be implemented in the arrangement of fuses of FIG. 1;

DETAILED DESCRIPTION OF THE INVENTION

This invention is described in preferred embodiments in the following description with reference to the Figures, in which like numbers represent the same or similar elements. While this invention is described in terms of the best mode for achieving this invention's objectives, it will be appreciated by those skilled in the art that variations may be accomplished in view of these teachings without deviating from the spirit or scope of the invention.

Figure 1:
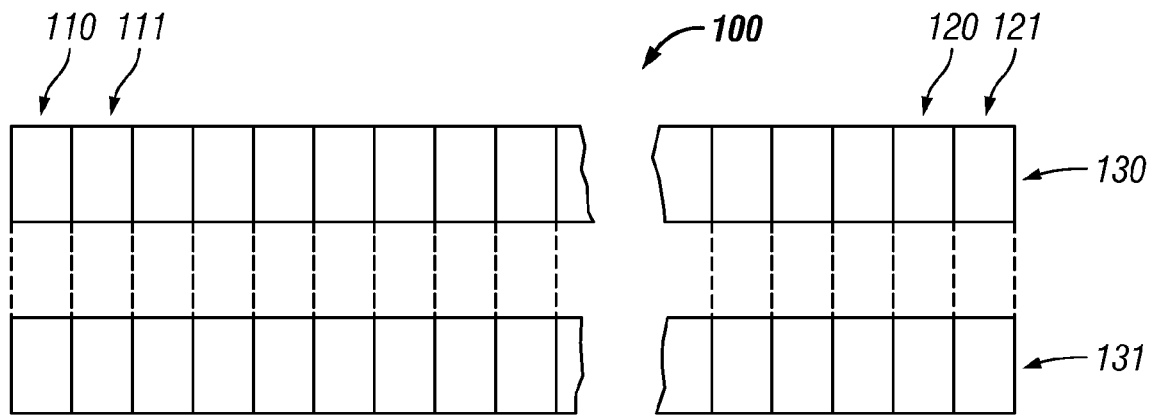
FIG. 1 is a block diagram of an exemplary arrangement of fuses in pairs in accordance with the present invention.
Figure 2A:
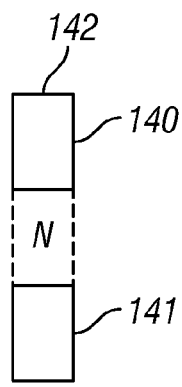
FIGS. 2A, 2B, 2C and 2D are block diagrams of examples of representations made by a pair of fuses of FIG. 1.
Figure 2B:
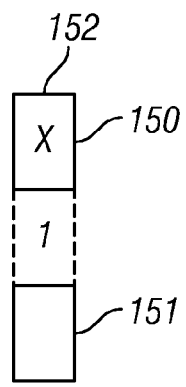
Figure 2C:
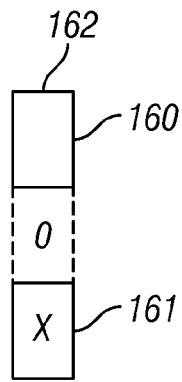
Figure 2D:
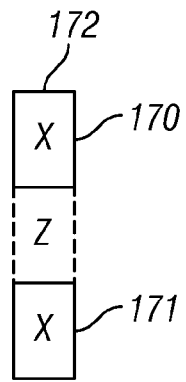

Referring to FIG. 1, fuses 100 are arranged in pairs 110, 111, . . . 120, 121, each pair representing a single bit. Fuses 130 of each pair represent, for example, a "1" if blown, and fuses 131 of each pair represent a "0" if blown. FIGS. 2A, 2B, 2C and 2D are examples of representations made by a pair of fuses of FIG. 1. In FIG. 2A, both fuse 140 and fuse 141 of pair 142 are intact, and represent, for example, a null, or a fuse pair that has not been programmed. In another example, blowing one fuse of a pair represents a data bit; such as blowing a fuse 150 at one side of the pair 152 while fuse 151 is intact represents a "1" as illustrated in FIG. 2B where an "X" indicates a blown fuse. Blowing a fuse 161 at the other side of the pair 162 while fuse 160 remains intact represents a "0" as illustrated in FIG. 2C. In still another example as illustrated in FIG. 2D, represents a zero-ized bit when both fuses 170 and 171 of the pair 172 are blown.

Techniques for blowing fuses are known in the art. For example, e-Fuses are blown by having the fuse transmit a current greater than a given threshold. As illustrated in FIG. 3, fuses 180 and 181 are connectable between line 182 and ground 183, 184 by gates 185, 186. When gate 186 is operated and a high voltage (such as 3.3 volts) is applied to line 182, the current flow between the high voltage line 182 and ground 184 through the fuse 181 is sufficient to blow the fuse 181, while fuse 180 is left intact due to the inoperation of gate 185. The fuses may be embedded within a chip to the extent that the specific fuses that are intact or blown are not directly detectable by viewing. In another example, a laser 190 of FIG. 4A is directed at fuse 192 on substrate 193 for a period and at a power sufficient to blow the fuse, while the laser is not directed at fuse 191. If it is desired to hide the fuses from direct viewing, in FIG. 4B a coating 195 is applied 194 to cover the fuses.

Fuses are employed for applications which encode data that is intended to persist unchanged and that is desired to be maintained indefinitely without requiring battery backup. One example of such data comprises a device serial number and data about the device. Once the data has been encoded, the data cannot typically be changed. Another example comprises a permanent encryption key such as that may be used for encrypting and decrypting data about a device in which the fuses are embedded, such as device metadata. An encryption engine will have the only access to the encryption key for encrypting or decrypting the data. The present invention allows constant visibility to the state of the key without allowing actual access to the encoded values.

Figure 5:
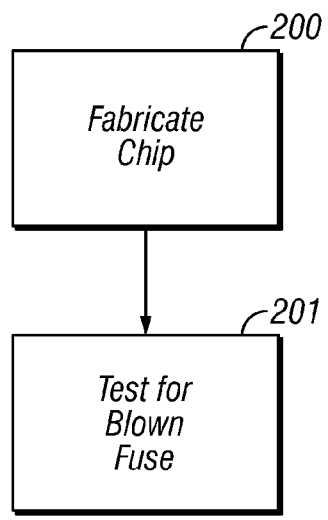
FIG. 5 is a flow chart depicting an example of a fabrication process for the arrangement of fuses of FIG. 1.
Figure 6:
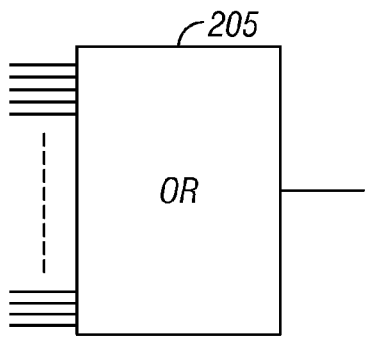
FIG. 6 is a block diagram of an exemplary arrangement for testing the arrangement of fuses of FIG. 1.
Figure 7:
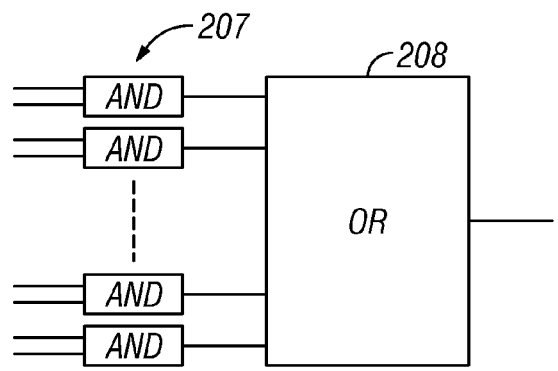
FIG. 7 is a block diagram of another exemplary arrangement for testing the arrangement of fuses of FIG. 1.

Referring to FIGS. 5, 6 and 7, the chip embodying the pairs of fuses is fabricated employing known techniques in step 200. In step 201, after the chip has been fabricated, the pairs of fuses are tested for blown fuses.

In one embodiment, the applied test 201 is to determine whether any fuse is blown, so that if the fuses pass the test, all of the pairs of fuses comprise null un-programmed bits where both fuses are intact, else the test is failed if any pair is other than null. In one example, an OR circuit 205 of FIG. 6 is applied to each fuse to detect all of the fuses and determine whether any fuse is blown.

In another embodiment, the applied test 201 is to detect whether any pair of fuses is zero-ized, which for example could render the set of fuses unusable. A zero-ized pair of fuses means that both fuses are blown, and that providing a bit where only one fuse is blown to form the bit is impossible. In one example, AND circuits 207 of FIG. 7 are coupled to each fuse of each pair of fuses, and OR circuit 208 combines the results to indicate whether any pair of fuses is zero-ized, meaning that both fuses of the pair are blown. Under this test, one or more fuses may be blown, but no two fuses of the same pair are blown. The present invention, in one embodiment, allows the possibility of being programmed despite having at least one blown fuse.

Whichever test 201 is applied, a failing chip is discarded. Everything else being equal, such as satisfactory yields, the test of FIG. 6 is preferred, failing and discarding a chip if any fuse is blown.

Chips that pass the test of step 201 are then made available for programming the pairs of fuses. If the fuses are to be programmed for a situation requiring security, the un-programmed chip is placed in a secure environment by the customer or organization charged with programming the chip.

Figure 8:
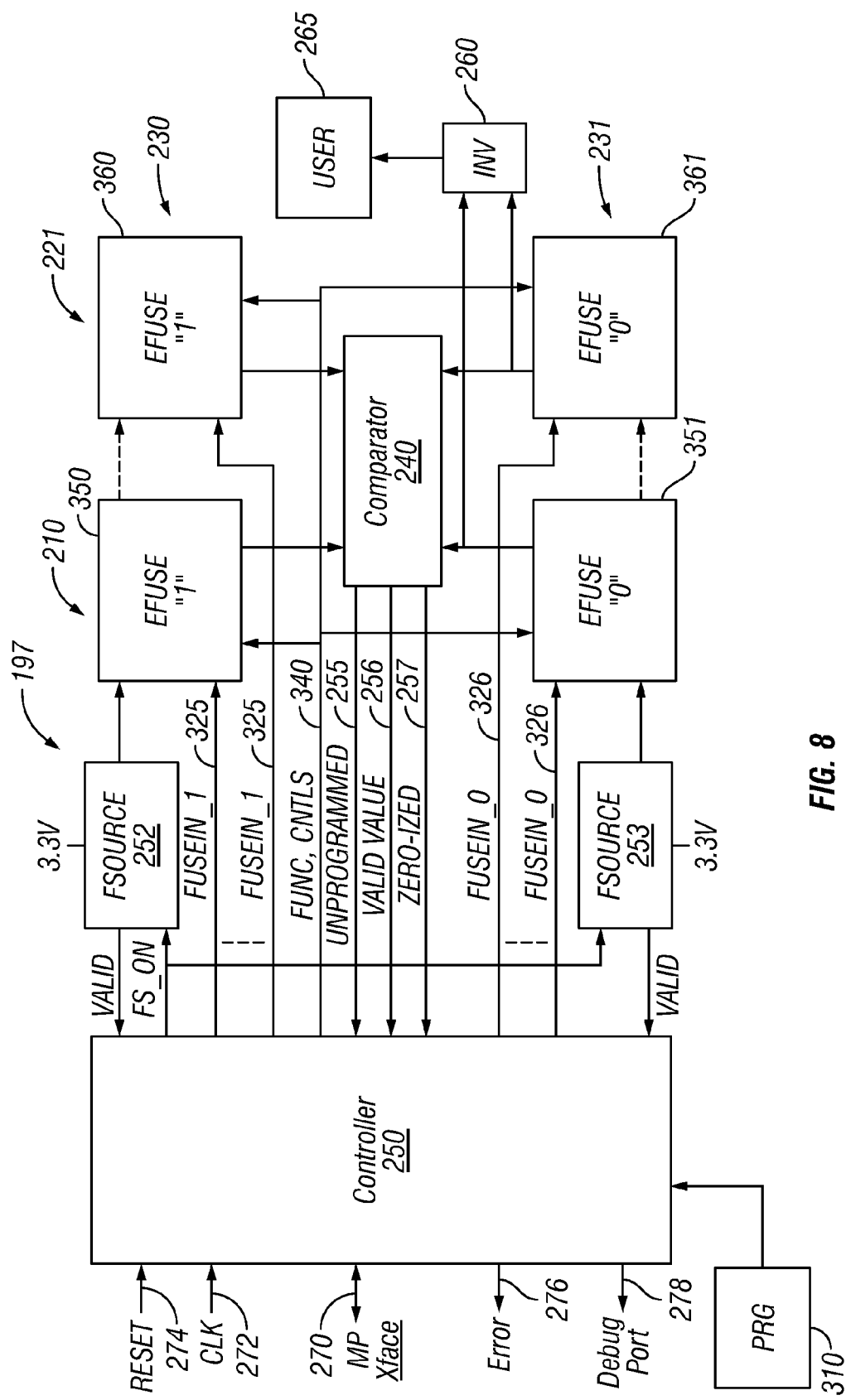
FIG. 8 is a block diagram of an exemplary arrangement for programming and operating the arrangement of fuses of FIG. 1.

An example of an arrangement of e-Fuses and the circuitry to program and read the e-Fuses is illustrated in FIG. 8.

The fuses of a chip 197 are arranged in the manner of FIG. 1, where the fuses are arranged in pairs 210, . . . 221, each pair representing a single bit. Fuses 230 of each pair represent, for example, a "1" if blown, and fuses 231 of each pair represent a "0" if blown.

In the example of FIG. 8, there are 128 pairs of fuses, comprising a total of 256 fuses.

A comparator 240 comprises the circuitry to determine the state of each pair of fuses. As discussed above, referring to FIG. 2A, both fuse 140 and fuse 141 of pair 142 are intact, and represent, for example, a null, or a fuse pair that has not been programmed. Blowing one fuse of a pair represents a data bit; such as blowing a fuse 150 at one side of the pair 152 while fuse 151 is intact represents a "1" as illustrated in FIG. 2B where an "X" indicates a blown fuse. Blowing a fuse 161 at the other side of the pair 162 while fuse 160 remains intact represents a "0" as illustrated in FIG. 2C. Either a "1" bit or a "0" bit where one fuse of the pair is blown is considered a "valid value" for a fuse pair. Referring to FIG. 2D, a zero-ized bit comprises the state when both fuses 170 and 171 of the pair 172 are blown.

Arranging the fuses in pairs allows the comparator 240 to detect and report valid or invalid bits without identifying the value of any bit.

Controller 250 of FIG. 8 may comprise part of the same chip 197 as the fuses 230, 231 and comparator 240, or may comprise a separate chip, and is employed to program the fuses. Fuse sources 252 and 253 provide the current which is gated under the control of controller 250 to blow the fuses as they are programmed. The comparator 240 provides information on lines 255, 256 and 257 to the controller to track the status of each pair of fuses. Each of the lines 255, 256 and 257, for example, comprises a set of 128 lines to indicate the status of each pair of fuses. Once programmed, the comparator 240 provides the data content of the fuses, via an inverter 260, to the using device 265. As one example, the data encoded into the fuses may comprise a secret encryption key. If the data encoded into the fuses is to be kept secret, no external access is allowed to the individual fuses 230, 231, the comparator 240, inverter 260, or the lines that interconnect these elements or to the using device 265. Direct access to the individual fuses is not available. Limiting the output information to lines 255, 256 and 257 prevents the identification of the value of any bit. Additionally, visual, radiation, etc., access to the fuses themselves is prevented, for example, by coatings to the fuses to prevent an external determination of the state of the fuses. Any such external access risks compromising the secret data stored by the fuses.

Figure 9:
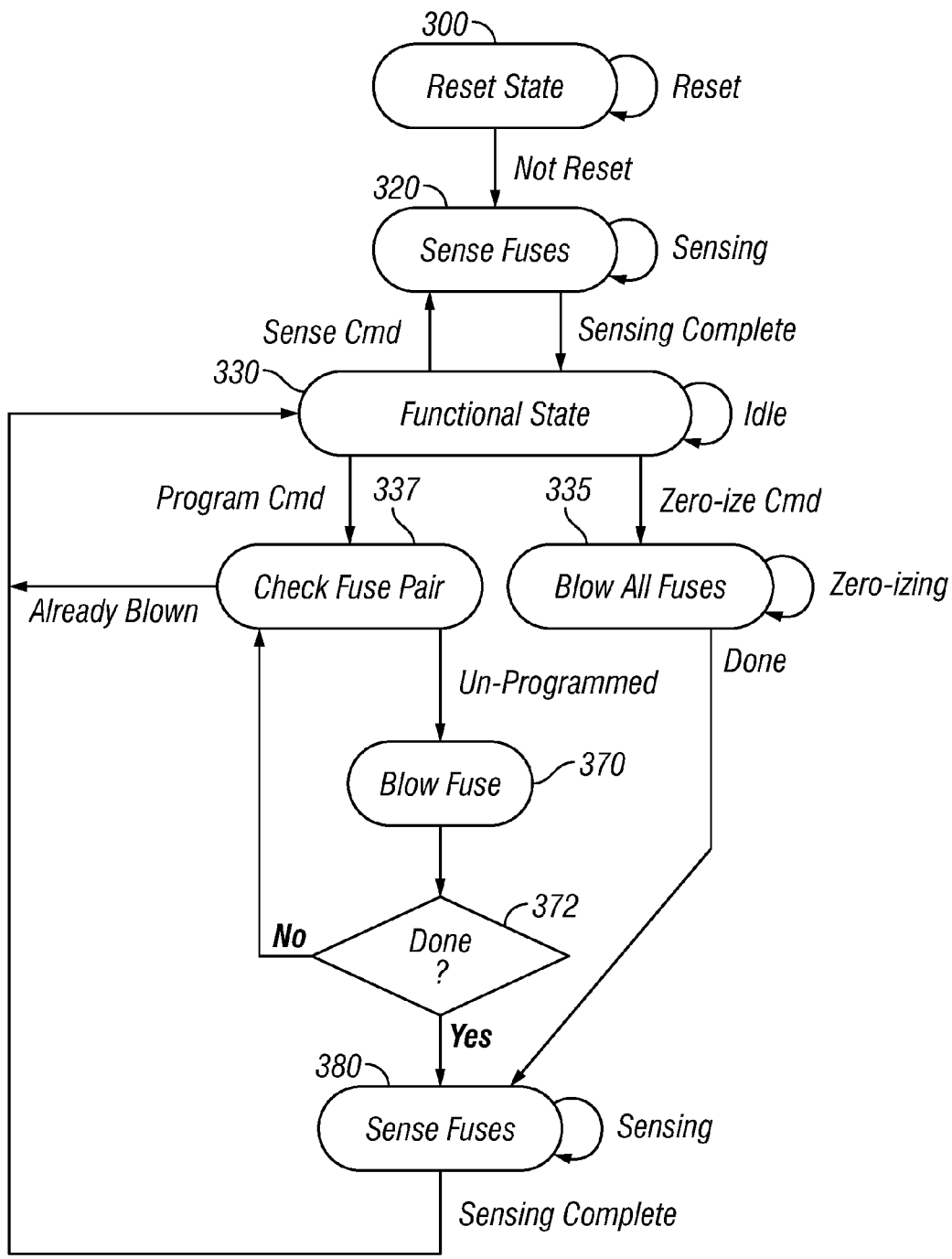
FIG. 9 is an example of states of the operation of the arrangement of FIG. 8.

FIG. 9 indicates the states of a state machine of controller 250 employed to program the fuses 230, 231 of FIG. 8. As discussed above, if the data is to be secure, the facility in which the programming occurs must be secure. The controller 250 may have various interfaces within the secure environment, such as a microprocessor interface 270, a clock input 272, an input 274 to reset the controller before programming a set of fuses, an output 276 to indicate an error, and a port 278 to provide information that may be useful to debug the controller.

Referring to FIGS. 8 and 9, the controller is reset at state 300, such as a POR (power on reset), and data to be programmed 310 is supplied to the controller 250. Prior to programming the fuses, in state 320, the controller checks the comparator 240 in accordance with one of the tests discussed above to determine whether any of the fuses has been blown after fabrication or prior to programming.

In one embodiment, the applied test 320 is to determine whether any fuse is blown, so that if the fuses pass the test, all of the pairs of fuses comprise null un-programmed bits where both fuses are intact, else the test is failed if any pair is other than null. This comprises checking the lines 255 for all of the pairs of fuses to determine whether they are all null un-programmed bits, else if any pair is other than null, which means that the test is to detect whether any fuse is blown.

In another embodiment, the applied test 320 is to detect whether any pair of fuses is zero-ized, which renders the set of fuses unusable. A zero-ized pair of fuses means that both fuses are blown, and that providing a bit where only one fuse is blown to form the bit is impossible. This test involves checking the lines 257 to indicate whether any pair of fuses is zero-ized, meaning that both fuses of the pair are blown.

In one embodiment, the fuse is sensed by the controller 250 activating a functional control line 340 for the desired fuse or fuses to set a latch at each fuse with its value, and the comparator logic provides the resultant signals on lines 255, 256, and 257. The sense lines may gate a sense current to the fuse and operate a latch to forward the data to the logic of comparator 240.

Under the test of state 320, as pointed out in FIGS. 5 and 6 or 7, the fuses pass the test if one or more fuses may be blown, but no two fuses of the same pair is blown.

Whichever test 320 is applied, a failing chip that is not yet in a device is discarded. Everything else being equal, since the present invention, in one embodiment, allows the possibility of being programmed despite having at least one blown fuse, the test of lines 257 is preferred at this stage, failing and discarding a chip only if both fuses of a pair are blown.

Upon completing the test 320, the controller enters a functional state 330. If the fuses failed the test 320, the fuses may be destroyed by blowing all fuses in state 335 to zero-ize the chip. If the fuses passed the test 320, the fuses are programmed beginning at state 337.

The fuses are blown by the controller 250 operating lines 325, 326 individually (lines 325, 326 each represents a set of individual lines to each fuse) to operate an associated gate (185, 186 of FIG. 3) to gate the current from the associated fuse source 252, 253 (182 of FIG. 3) through the fuse to ground and blow the fuse. In one embodiment, the fuse sources comprise the appropriate voltage and accommodate the appropriate current to blow one fuse at a time.

In state 335, the fuses are blown, for example, in sequence, beginning by blowing fuses 350 and 351 of pair 210, and proceeding sequentially to fuses 360 and 361 of pair 221. When done, the fuses are sensed in state 380, for example, by sensing lines 257 to insure that each pair of fuses is now zero-ized.

If the fuses passed the test 320, the fuses are programmed beginning at state 337, in one embodiment, on a pair by pair basis. For example, the sense lines 340 for the pair are operated and the valid value line 256 for the pair is checked. In one embodiment, the programming is conducted in a fault-tolerant manner, understanding that, if one fuse of a pair has been blown prior to programming the pair, there is a 50% chance that the bit is correct. Thus, the pair is skipped from programming, and a subsequent verification procedure conducted to determine whether the bit happened to be correct. If more than one pair has a fuse blown, the chance that the correct combination of fuses are blown is reduced accordingly, for example, two blown fuses in two pair represents a 25% chance that the combination of fuses is correct. Thus, if state 337 indicates that a fuse of the pair is blown, for example by checking line 255 for that pair, programming that pair is skipped and the controller returns to state 330 to check the next pair. The controller 250 provides storage to store the identification of the bit that has been skipped.

In one embodiment, the instances of state 337 are conducted in sequence, beginning at pair 210 by checking fuses 350 and 351 of pair 210, and proceeding sequentially to fuses 360 and 361 of pair 221.

If the controller operates sense lines 340 for the desired pair of fuses and checks line 255 for the pair in state 337 and determines that the pair is un-programmed, one of the fuses is blown in state 370 in accordance with the program data for that bit. State 372 determines whether all of the data has been programmed, and, if not, the controller 250 returns to state 337 to check the next pair of fuses in the sequence. If it is also un-programmed, the controller backs out, returns to state 337 to test the value and then in state 370 programs the bit represented by the pair by blowing one of the fuses.

In one embodiment, state 337 may also comprise testing the validity of each pair of fuses subsequent to programming the pair, for example by operating sense lines 340 for the pair and checking the valid value line 256 for that pair of fuses.

When state 372 indicates that all of the data has been programmed, such as by reaching bit 221 and blowing either fuse 360 or fuse 361, the fuses are sensed by controller 250 at state 380. In one embodiment, state 380 operates the sense lines and state 330 determines whether each pair of fuses has been programmed to a "1" bit or "0" bit, else that at least one bit pair is invalid by sensing lines 256. The comparator may respond to the operation of the sense lines 340 by conducting an "Exclusive-OR" of both bits of each pair of fuses to determine whether the pair of fuses has been programmed validly and one and only one of the fuses of the pair has been blown. The data content is not checked in any way, only the validity of the pair is checked in this manner. Thus, security is preserved in that there is no means of sensing the data content at the comparator available for use at the controller 250, nor can the data content be read via the microprocessor interface 270 or the hardware debug port 278.

In the event that one of the fuses had been blown prior to programming and that bit had therefore been skipped at state 337, another check at state 380 is to test the validity of the programming by running a trial; and, if the trial fails, indicating that the identified bit pair comprises an inverted bit. A trial failure indicates that the blown fuse is incorrect. It may be possible to alter the data 310 to fit the inverted bit, and the trial is conducted again until the appropriate bit has been reversed and the data is correct.

If the last trial made does not result in correct data, or if the data 310 is not changed or a limit of changes has been reached, the controller may enter state 335 to blow all of the fuses and zero-ize the chip. Once all fuses have been blown, no data is available to be detected from analysis of the chip.

Alternatively, in the product environment, it may be possible to operate circuit 260 as an AND and force all bits to zero.

If the programmed data is an encryption key, the trial comprises using the key to decrypt known encrypted data and finding whether the decryption was successful. The test, if the data is secret, is to be conducted within the secure environment.

Once the chip has been validly programmed and placed in a device, the chip, for example, goes to the reset state 300 at a power on reset (POR). The sense lines 340 are activated in step 320 and the chip enters the functional state 330 where the values are available to the user 265 and remains at idle in the functional state. The chip remains in the functional state until a power off, and is reset at a subsequent power on reset.

The security resulting from the operation depicted in FIGS. 8 and 9 meets or exceeds the requirements of applicable security standards.

If the chip is in a device when it is zero-ized, it cannot be discarded. For example, if intended to hold an encryption key, the chip cannot be used for encryption, but the device can still be used for all other functions.

Figure 10:
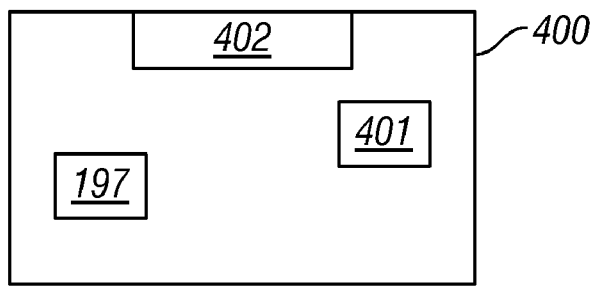
FIG. 10 is a block diagram of a device implementing the arrangement of fuses of FIG. 1.
Figure 11:
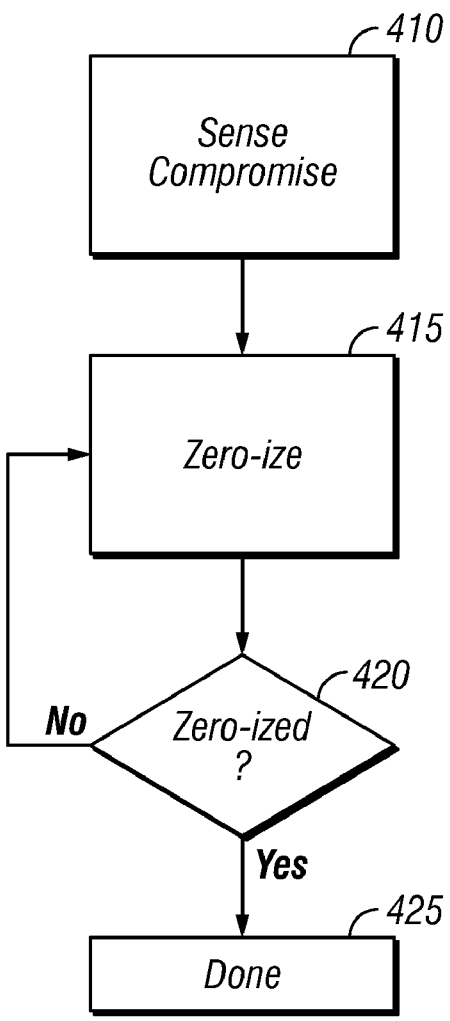
FIG. 11 is a flow chart depicting an example of operating the device of FIG. 10 in the event of a compromise to the device.

Referring to FIGS. 10 and 11, the chip 197 is provided in a device 400. The device 400 comprises a functional system 401, a compromise detection system 402 configured to detect whether the functional system is compromised, and an encoded fuse system 197 comprising a plurality of fuses arranged in pairs and encoded such that each pair of fuses represents a data bit when one fuse of the pair is blown. A fuse blowing system, for example of the chip 197, is configured to respond to the compromise detection system 402 detecting that the functional system is compromised, to blow all unblown fuses of the pairs, such that both fuses of each pair is blown to represent a zero-ized pair, thereby "zero-izing" the plurality of fuses, which for example could render the set of fuses unusable and therefore the data content before being blown unknown.

Referring additionally to FIG. 8, if the compromise detection system 402 detects the device compromise at state 410, controller 250, if a part of chip 197, at state 415 operates fuse lines 325, 326 individually (lines 325, 326 each represents a set of individual lines to each fuse) to operate an associated gate (185, 186 of FIG. 3) to gate the current from the associated fuse source 252, 253 (182 of FIG. 3) through the fuse to ground and blow the fuse.

In state 415, the fuses are blown, for example, in sequence, beginning by blowing fuses 350 and 351 of pair 210, and proceeding sequentially to fuses 360 and 361 of pair 221. When done, the fuses are sensed in state 420, for example, by sensing lines 257 to insure that each pair of fuses is now zero-ized, and if not done, the zero-izing continues, and, if done, at state 425, the set of fuses is rendered unusable and therefore the data content before being blown is unknown.

Alternative arrangements of the controller 250, chip 197, and alternative arrangements of the states of FIGS. 9 and 11 may be employed.

The implementations may involve software, firmware, micro-code, hardware and/or any combination thereof. The implementation may take the form of code or logic implemented in a medium, such as memory of controller 250, where the medium may comprise hardware logic (e.g. an integrated circuit chip, Programmable Gate Array [PGA], Application Specific Integrated Circuit [ASIC], or other circuit, logic or device), or a computer readable storage medium, such as a magnetic storage medium (e.g. an electronic, magnetic, optical, electromagnetic, infrared, or semiconductor system, semiconductor or solid state memory, magnetic tape, a removable computer diskette, and random access memory [RAM], a read-only memory [ROM], a rigid magnetic disk and an optical disk, compact disk—read only memory [CD-ROM], compact disk—read/write [CD-R/W] and DVD).

Those of skill in the art will understand that changes may be made with respect to the methods discussed above, including changes to the ordering of the steps of the state machines, those of skill in the art will understand that differing specific component arrangements may be employed than those illustrated herein.

While the preferred embodiments of the present invention have been illustrated in detail, it should be apparent that modifications and adaptations to those embodiments may occur to one skilled in the art without departing from the scope of the present invention as set forth in the following claims.

What is claimed is:

1. A fuse encoding system comprising:
   a plurality of fuses arranged in pairs and configured such that each pair of fuses represents a data bit when one fuse of said pair is blown; represents an un-programmed bit when no fuse of said pair is blown; and represents a zero-ized bit when both fuses of said pair are blown.

2. The fuse encoding system of claim 1, additionally comprising a detection system configured to detect whether any said pair of fuses is zero-ized.

3. A fuse programming system comprising:
a plurality of fuses arranged in pairs; and
a fuse blowing system configured to program said fuses of said pairs such that each pair represents a bit, comprising to blow a first fuse of a pair to represent a "1" bit, to blow a second fuse of a pair to represent a "0" bit, and to blow both fuses of a pair to represent a zero-ized pair, whereby if neither fuse of a pair is blown represents a null, un-programmed bit.

4. The fuse programming system of claim 3, additionally comprising a detection system configured to detect, prior to programming any of said pairs, whether any said pair of fuses is zero-ized.

5. The fuse programming system of claim 3, additionally comprising a test system configured to test both bits of a pair of said fuses prior to programming said pair of fuses to test whether either said fuse of said pair is blown.

6. The fuse programming system of claim 5, additionally comprising storage to identify any bit pair found by said test system to have a fuse of said pair blown; and wherein said fuse blowing system is configured to skip and not blow any fuse of said found pair of fuses.

7. The fuse programming system of claim 6, additionally comprising a trial test system for testing the validity of said programming by running a trial; and, if said trial fails, indicating that said identified bit pair comprises an inverted bit.

8. The fuse programming system of claim 3, additionally comprising a detection system configured to detect, prior to programming any of said pairs, whether all of said pairs of fuses comprise null un-programmed bits, else if any said pair is other than null.

9. The fuse programming system of claim 3, additionally comprising a test system configured to test the validity of each pair of fuses subsequent to programming said pair.

10. The fuse programming system of claim 3, additionally comprising a test system configured to test both bits of each pair of said fuses and determine whether each pair of said fuses has been programmed to a "1" bit or "0" bit, else that at least one bit pair is invalid.

11. The fuse programming system of claim 10, wherein said fuse blowing system is additionally configured to, if at least one bit pair is determined to be invalid, blow all unblown fuses of said pairs, thereby "zero-izing" said plurality of fuses.

12. The fuse programming system of claim 11, additionally comprising a detection system configured to detect, subsequent to blowing said unblown fuses of said pairs, whether all said pairs of fuses is zero-ized.

13. In a device comprising a functional system and a compromise detection system configured to detect whether said functional system is compromised, and an encoded fuse system comprising a plurality of fuses arranged in pairs and encoded such that each pair of fuses represents a data bit when one fuse of said pair is blown:
a fuse blowing system configured to respond to said compromise detection system detecting that said functional system is compromised, to blow all unblown fuses of said pairs, such that both fuses of each pair is blown to represent a zero-ized pair, thereby "zero-izing" said plurality of fuses.

14. A method for configuring a plurality of fuses for encoding, comprising:
arranging a plurality of fuses in pairs; and
configuring said pairs of fuses such that each pair of fuses represents a data bit when one fuse of said pair is blown; represents an un-programmed bit when no fuse of said pair is blown; and represents a zero-ized bit when both fuses of said pair are blown.

15. A method for encoding a plurality of fuses arranged in pairs, comprising:
programming said pairs of fuses:
blowing a first fuse of a pair to represent a "1" bit;
blowing a second fuse of a pair to represent a "0" bit; and
blowing both fuses of a pair to represent a zero-ized pair, whereby if neither fuse of a pair is blown represents a null, un-programmed bit.

16. The method of claim 15, additionally comprising detecting, prior to programming any of said pairs, whether any said pair of fuses is zero-ized.

17. The method of claim 15, additionally comprising testing both bits of a pair of said fuses prior to programming said pair of fuses to test whether either said fuse of said pair is blown.

18. The method of claim 17, additionally comprising storing the identity of any bit pair found by said testing to have a fuse of said pair blown; and wherein said fuse blowing programming step additionally comprises skipping and not blowing any fuse of said found pair of fuses.

19. The method of claim 18, additionally comprising trial testing the validity of said programming by running a trial; and, if said trial fails, indicating that said identified bit pair comprises an inverted bit.

20. The method of claim 15, additionally comprising null detecting, prior to programming any of said pairs, whether all of said pairs of fuses comprise null un-programmed bits, else if any said pair is other than null.

21. The method of claim 15, additionally comprising pair testing the validity of each pair of fuses subsequent to programming said pair.

22. The method of claim 15, additionally comprising testing all said pairs by testing both bits of each pair of said fuses; and determining whether each pair of said fuses has been programmed to a "1" bit or "0" bit, else that at least one bit pair is invalid.

23. The method of claim 22, additionally comprising, if said determining step determines at least one bit pair is invalid, blowing all unblown fuses of said pairs, thereby "zero-izing" said plurality of fuses.

24. The method of claim 23, additionally comprising detecting, subsequent to blowing said unblown fuses of said pairs, whether all said pairs of fuses is zero-ized.

25. In a device comprising a functional system, a compromise detection system configured to detect whether said functional system is compromised, and an encoded fuse system comprising a plurality of fuses arranged in pairs and encoded such that each pair of fuses represents a data bit when one fuse of said pair is blown; the method comprising:
in response to said compromise detection system detecting that said functional system is compromised, blowing all unblown fuses of said pairs, such that both fuses of each pair is blown to represent a zero-ized pair, thereby "zero-izing" said plurality of fuses.

* * * * *